(12) United States Patent
Gosen et al.

(10) Patent No.: US 11,764,027 B2
(45) Date of Patent: Sep. 19, 2023

(54) SYSTEMS AND METHODS OF COOLING OBJECTIVE LENS OF A CHARGED-PARTICLE BEAM SYSTEM

(71) Applicant: ASML Netherlands B.V., Veldhoven (NL)

(72) Inventors: Jeroen Gerard Gosen, Westport, CT (US); Sven Antoin Johan Hol, San Jose, CA (US); Martijn Petrus Christianus Van Heumen, Santa Clara, CA (US); Dennis Herman Caspar Van Banning, Best (NL); Naseh Hosseini, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 631 days.

(21) Appl. No.: 16/698,677

(22) Filed: Nov. 27, 2019

(65) Prior Publication Data
US 2020/0176215 A1 Jun. 4, 2020

Related U.S. Application Data

(60) Provisional application No. 62/773,972, filed on Nov. 30, 2018.

(51) Int. Cl.
*H01J 37/141* (2006.01)

(52) U.S. Cl.
CPC ....... *H01J 37/141* (2013.01); *H01J 2237/002* (2013.01)

(58) Field of Classification Search
CPC .......... H01J 37/10; H01J 37/14; H01J 37/141; H01J 2237/002; H01J 2237/14; H01J 2237/1405; H01J 2237/141
See application file for complete search history.

(56) References Cited

U.S. PATENT DOCUMENTS

| 5,289,009 A | 2/1994 | Bakker et al. |
| 5,382,800 A | 1/1995 | Nishino et al. |

(Continued)

FOREIGN PATENT DOCUMENTS

| EP | 3 200 216 A1 | 8/2017 |
| JP | S 57140169 A | 8/1982 |

(Continued)

OTHER PUBLICATIONS

Engineering ToolBox, (2005). Metals, Metallic Elements and Alloys—Thermal Conductivities. [online] Available at: https://www.engineeringtoolbox.com/thermal-conductivity-metals-d_858.html [Accessed Apr. 25, 2022]). (Year: 2005).*

(Continued)

*Primary Examiner* — David E Smith
(74) *Attorney, Agent, or Firm* — Finnegan, Henderson, Farabow, Garrett & Dunner, LLP

(57) ABSTRACT

Systems and methods for cooling an objective lens of a charged-particle beam system are disclosed. According to certain embodiments, the method for cooling an objective lens of a charged-particle beam system comprises receiving a fluid via a fluid input port of a bobbin, circulating the fluid that absorbs heat generated by a plurality of electromagnetic coils of the objective lens, via a plurality of channels distributed in the bobbin, and dispensing the fluid circulated by the plurality of channels via a fluid output port of the bobbin. The bobbin may further comprise a bottom flange proximal to a wafer and a top flange distal from the wafer. The bobbin having the plurality of channels may comprise an additively manufactured monolithic structure.

17 Claims, 11 Drawing Sheets

(56) References Cited

U.S. PATENT DOCUMENTS

| | | | | |
|---|---|---|---|---|
| 6,053,241 | A | * | 4/2000 | Kendall ................ H01J 37/141 |
| | | | | 165/80.4 |
| 7,345,287 | B2 | * | 3/2008 | Jasinski ................ H01J 37/141 |
| | | | | 165/104.33 |
| 11,348,756 | B2 | | 5/2022 | Van Veen et al. |
| 2017/0213689 | A1 | * | 7/2017 | Abe ...................... H01J 37/141 |
| 2018/0032059 | A1 | * | 2/2018 | Morovic ............ G05B 19/4099 |

FOREIGN PATENT DOCUMENTS

| | | | |
|---|---|---|---|
| JP | 61227356 A | * | 10/1986 |
| JP | S61227356 A | | 10/1986 |
| JP | 2000048750 A | | 2/2000 |
| TW | 2017-27690 A | | 8/2017 |
| WO | WO 2007041059 A2 | | 4/2007 |

OTHER PUBLICATIONS

Engineering ToolBox, (2005), Metals, Metallic Elements and Alloys—Thermal Conductivities [online] Available at https://www.engineeringtoolbox.com/thermal-conductivity-metals-d_858.html [Accessed Apr. 25, 2022] (Year: 2022).*

Office Action issued by the Chinese Intellectual Property Office (IPO) in related Application No. 108142266, dated Sep. 18, 2020 (13 pgs.).

International Search Report issued by the International Searching Authority in related PCT Application No. PCT/EP2019/081070, dated Jun. 24, 2020 (7 pgs.).

\* cited by examiner

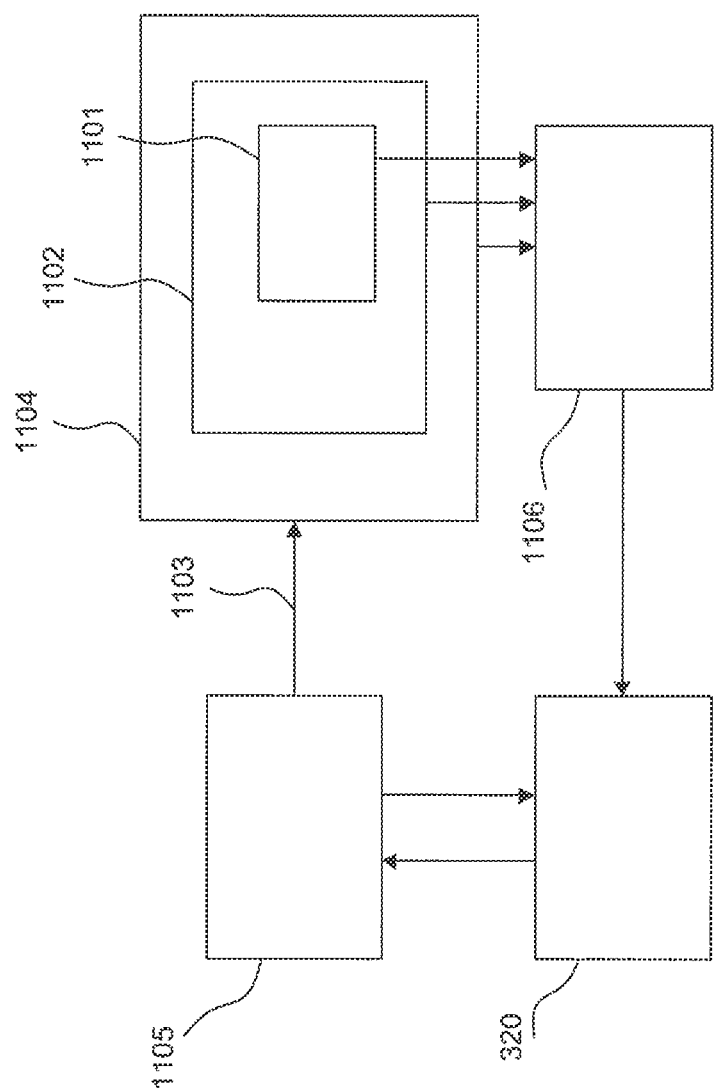

SYSTEMS AND METHODS OF COOLING OBJECTIVE LENS OF A CHARGED-PARTICLE BEAM SYSTEM

CROSS-REFERENCE TO RELATED APPLICATIONS

This application claims priority of U.S. application 62/773,972 which was filed on Nov. 30, 2018, and which is incorporated herein in its entirety by reference.

TECHNICAL FIELD

The embodiments provided herein disclose an objective lens structure of a charged-particle beam system, and more particularly systems and methods of cooling the objective lens structure to, for example, minimize thermal drift in the charged-particle beam system.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. Multiple charged-beams may be employed to address the inspection throughput requirements; however, imaging resolution of multiple charged-beam systems may be compromised, rendering the inspection tools inadequate for their desired purpose.

Thus, related art systems face limitations in, for example, image resolution and beam-spot positioning accuracy due to large thermal drifts caused by significant electric current through the electromagnetic coils of the objective lens assembly. Further improvements in the art for cooling the objective lens assembly of a charged-particle beam system are desired.

SUMMARY

In one aspect, the present disclosure is directed to a bobbin for cooling an objective lens of a charged-particle beam system. The bobbin may include a fluid inlet port configured to receive a fluid, a plurality of channels distributed in the bobbin and configured to circulate the fluid received by the fluid inlet port, and a fluid outlet port configured to dispense the fluid circulated by the plurality of channels. The bobbin may further include a bottom flange proximal to a wafer in the charged-particle beam system and a top flange distal from the wafer. The plurality of channels include an inlet channel configured to circulate the fluid received from the fluid inlet port, an outlet channel configured to direct the circulating fluid to the fluid outlet port, and an intermediate channel fluidly connected with the inlet and the outlet channel. The circulated fluid may absorb heat generated by a plurality of electromagnetic coils wound around at least a portion of the bobbin. The fluid may include one of a liquid, a coolant, a gas, a compressed gas, or mixtures thereof. The plurality of channels may include a material having thermal conductivity in a range of 20-2000 W·m−1·K−1 and the material may comprise aluminum, titanium, copper, graphite, aluminum carbide, aluminum nitride, plastics, composites, or alloys. The bobbin having the plurality of channels may comprise a monolithic structure or a plurality of parts coupled together. The monolithic structure may be an additively manufactured monolithic structure. The additively manufactured monolithic structure may comprise at least one of a metal, a metal alloy, a ceramic, or a ceramic composite.

In another aspect, the present disclosure is directed to a method of creating a computer-readable three-dimensional model suitable for use in manufacturing the bobbin including a fluid inlet port configured to receive a fluid, a plurality of channels distributed in the bobbin and configured to circulate the fluid received by the fluid inlet port, and a fluid outlet port configured to dispense the fluid circulated by the plurality of channels. The method may include inputting data representing the bobbin to a computer, and using the data to represent the bobbin as a three-dimensional model, the three-dimensional model being suitable for use in manufacturing the bobbin.

In yet another aspect, the present disclosure is directed to an objective lens structure. The objective lens structure may include a plurality of electromagnetic coils, and a bobbin configured to circulate a fluid to absorb heat generated by the plurality of electromagnetic coils. The bobbin may include a fluid inlet port configured to receive a fluid, a plurality of channels distributed in the bobbin and configured to circulate the fluid received by the fluid inlet port, and a fluid outlet port configured to dispense the fluid circulated by the plurality of channels. The objective lens structure may further include a thermal insulation layer disposed circumferentially between the plurality of electromagnetic coils and a ferromagnetic housing of an objective lens. The thermal insulation layer may include a fluid channel configured to absorb heat generated by the plurality of electromagnetic coils.

In yet another aspect, the present disclosure is directed to a method of cooling an objective lens of a charged-particle beam system. The method may include receiving a fluid via a fluid inlet port of a bobbin, circulating the fluid that absorbs heat generated by a plurality of electromagnetic coils of the objective lens, via a plurality of channels distributed in the bobbin, and dispensing the fluid circulated by the plurality of channels via a fluid outlet port of the bobbin. The plurality of channels may include an inlet channel configured to circulate the fluid received from the fluid inlet port, an outlet channel configured to direct the circulating fluid to the fluid outlet port, and an intermediate channel fluidly connected with the inlet and the outlet channel. The circulated fluid may absorb heat generated by the plurality of electromagnetic coils wound around at least a portion of the bobbin. The method may further include circulating a second fluid in a fluid channel of a thermal insulation layer disposed circumferentially between the plurality of electromagnetic coils and a ferromagnetic housing of the objective lens. Each of the first and the second fluid may comprise one of a liquid, a coolant, a gas, a compressed gas, or mixtures thereof.

In yet another aspect, the present disclosure is directed to a computer readable storage medium storing data representing a bobbin that is printable on a 3D printer. The bobbin represented by the stored data may include a fluid inlet port configured to receive a fluid, a plurality of channels distributed in the bobbin and configured to circulate the fluid received by the fluid inlet port, and a fluid outlet port configured to dispense the fluid circulated by the plurality of channels.

In yet another aspect, the present disclosure is directed to a computer readable three-dimensional model of a physical bobbin printable on a 3D printer, the bobbin including a fluid inlet port configured to receive a fluid, a plurality of channels distributed in the bobbin and configured to circulate the fluid received by the fluid inlet port, and a fluid outlet port configured to dispense the fluid circulated by the plurality of channels.

BRIEF DESCRIPTION OF FIGURES

FIG. 11 is a schematic drawing representing a system for generating a three-dimensional model of an exemplary bobbin.

DETAILED DESCRIPTION

Figure 1:
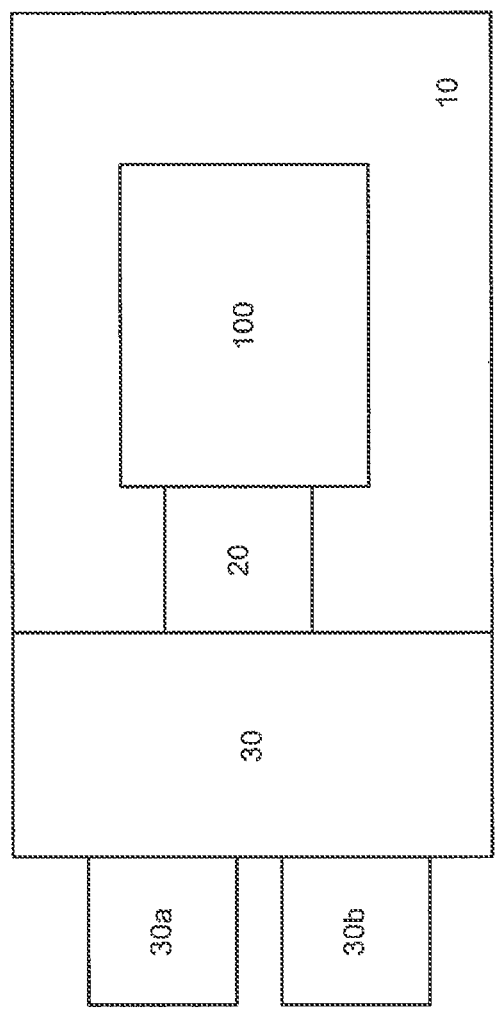
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools, such as a SEM, may be essential for maintaining high yields and low cost.

In a charged-particle beam imaging or inspection system, such as a SEM, the charged-particle beam may be focused on the wafer using an electromagnetic lens having electromagnetic coils circled around the lens (e.g., the coils being inside a ferromagnetic base). An electric current through the electromagnetic coils may generate a magnetic field that focuses or defocuses the charged-particle beam. The amount of heat generated may be proportional to the electric current passing through the coils and to the number of coils. In cases where the electromagnetic coils are near to the wafer, conductive and radiative heat losses may cause, among other problems, the wafer temperature to rise locally.

When manufacturing a computer chip or an integrated circuit, in some examples extremely small structures are formed on a silicon wafer. These structures may include transistors, capacitors, diodes, etc., which do the "thinking" of the computer chip, and metal wires that may be used to connect the transistors. These structures are extremely small, for example, 10,000 metal wires, each wire approximately 10 nm wide, placed side by side can fit within the width of a human hair. A computer chip can have several layers of metal wires, connecting the structures in horizontal or vertical planes. A metal wire on a first layer may be connected to a metal wire on a second layer by a contact hole cut between the two layers and that is filled with metal, so that the metal on the first layer connects to the bottom side of the metal in the contact hole, which runs vertically through an insulation layer and connects on the top side of the contact hole metal to the second layer. As you might imagine, with the incredibly small dimension of these wires and contact holes, they must be placed (also referred to as aligned) very precisely, or they will not line up properly in the final product. Even the smallest amount of misalignment may cause the connection from the first wire to the second wire via the contact hole metal to fail, which may render the entire computer chip defective.

Exposing the wafer to excessive heat for extended periods of time may cause the wafer to expand, with structures on the wafer resultantly drifting away from a target position due to the expansion of the wafer. In an example, the structures drifted away from a target position at a rate of ~8 nm every minute, detrimentally higher than an allowable limit. Such high thermal drift rates of the wafer can cause fatal errors when manufacturing the computer chip or locating a defect on the wafer. Even slight changes in temperature can cause the area of interest to rapidly drift out of the field of view of a SEM image, making it challenging to acquire images and analytical data from the area, thus adversely affecting the throughput and inspection yield. In addition, heat exposure to neighboring opto-electric components, such as position sensors, mirrors, motors, etc. can cause stage positioning error and beam placement accuracy error.

Thermal management issues may be accentuated in a multi-beam inspection tool. Though useful in increasing the wafer inspection throughput by using multiple beams to inspect a wafer, where each beam may image a different point on the wafer, multi-beam inspection tools may be plagued by excessive heat generation. Focusing multiple beams may require a larger number of electromagnetic coils or higher electric current to be passed through the electromagnetic coils, necessitating improved heat dissipation systems and methods.

In one aspect of the present disclosure, an objective lens structure including a plurality of electromagnetic coils and a bobbin may be used to cool an objective lens of a charged-particle beam system. The bobbin may include a fluid inlet port configured to receive a fluid, and a plurality of channels distributed in the bobbin configured to circulate the fluid received by the fluid inlet port. The circulating fluid may absorb the heat generated by passing electric current through the electromagnetic coils. The circulating fluid may then be dispensed to the outlet port through an outlet channel. The bobbin having a plurality of channels may be an additively manufactured monolithic structure, such as by being manufactured by a 3D printing process, among others. Some of the advantages of using an additively manufactured bobbin may be efficient heat dissipation from the electromagnetic coils, efficient space utilization, compatible material and design flexibility, improved reliability and manufacturability of objective lens.

In the context of this disclosure, a low thermal conductivity material may be defined as a material having thermal conductivity values in the range of 1-10 W·m−1·K−1 under standard measurement conditions. A high thermal conductivity material may be defined as a material having thermal conductivity values in the range of 20-2000 W·m−1·K−1 under standard measurement conditions.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C. or B and C, or A and B and C.

Reference is now made to FIG. 1, which illustrates an exemplary electron beam inspection (EBI) system 100 consistent with embodiments of the present disclosure. As shown in FIG. 1, charged-particle beam inspection system 1 includes a main chamber 10, a load/lock chamber 20, an electron beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100. While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
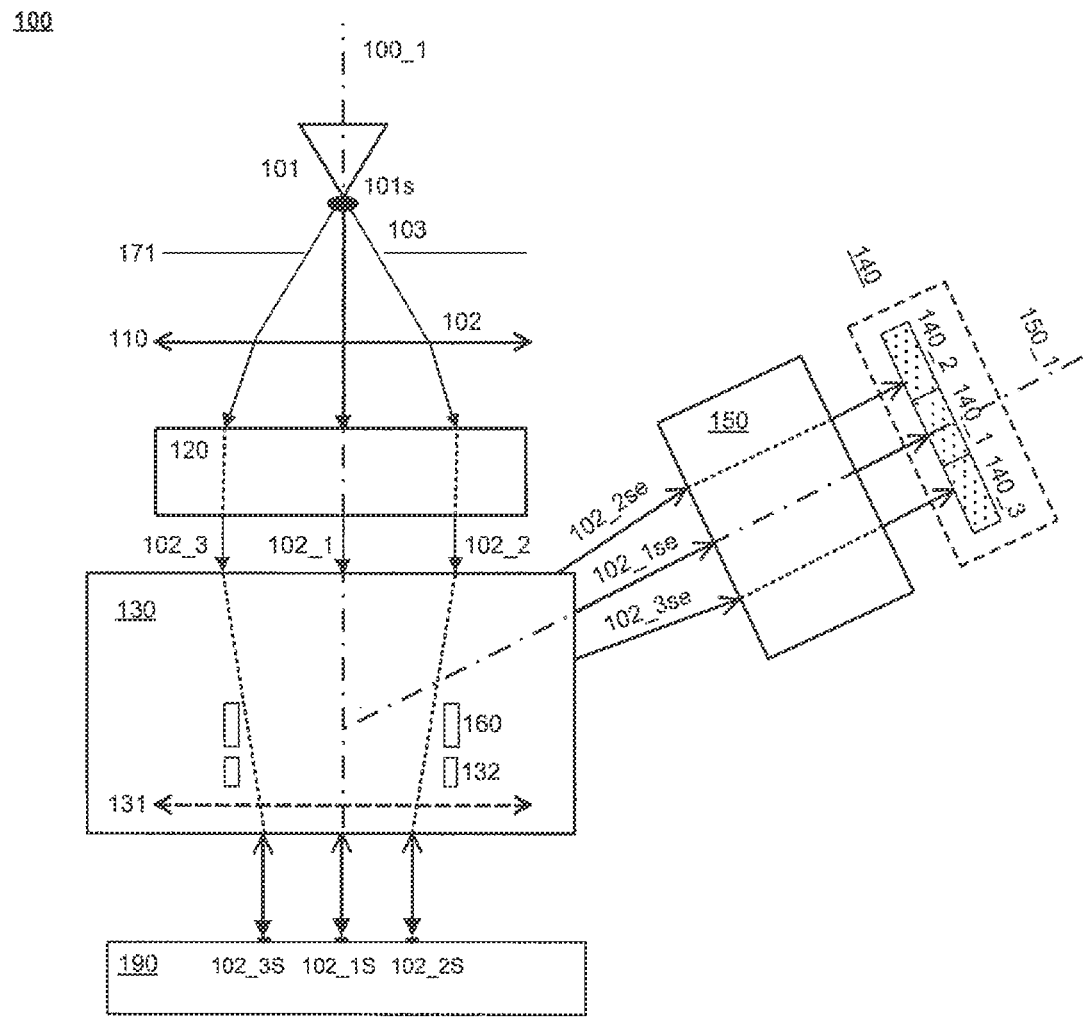
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool that can be a part of the exemplary charged-particle beam inspection system 1 of FIG. 1, consistent with embodiments of the present disclosure. An electron beam tool 100 (also referred to herein as apparatus 100) comprises an electron source 101, a gun aperture plate 171 with a gun aperture 103, a condenser lens 110, a source conversion unit 120, a primary projection optical system 130, a sample stage (not shown in FIG. 2), a secondary optical system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 100 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Many of the components of apparatus 100 may be partially or completed located within a vacuum chamber. For example, primary projection optical system 130 may be partially or completely located within a vacuum chamber, such as main chamber 10 of FIG. 1. Secondary optical system 150 and electron detection device 140 can be aligned with a secondary optical axis 150_1 of apparatus 100.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 can comprise an image-forming element array (not shown in FIG. 2). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets.

Condenser lens 110 can focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. Objective lens 131 can focus beamlets 102 . . . 1, 102_2, and 102_3 onto a sample 190 for inspection and can form three probe spots 102_1s, 102_2s, and 102_3s on surface of sample 190. Gun aperture plate 171 can block off peripheral electrons of primary electron beam 102 not in use to reduce Coulomb effect. The Coulomb effect can enlarge the size of each of probe spots 102_1s, 102_2s, and 102_3s, and therefore deteriorate inspection resolution.

Beam separator 160 can be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 190. In response to incidence of beamlets 102_1, 102_2, and 102_3 at probe spots 102_1s, 102_2s, and 102_3s, three secondary electron beams 102_1se, 102_2se, and 102_3se can be emitted from sample 190. Each of secondary electron beams 102_1se, 102_2se, and 102_3se can comprise electrons with a distribution of energies including secondary electrons (energies ≤50 eV) and backscattered electrons (energies between 50 eV and landing energies of beamlets 102_1, 102_2, and 102_3). Beam separator 160 can direct secondary electron beams 102_1se, 102_2se, and 102_3se towards secondary optical system 150. Secondary optical system 150 can focus secondary electron beams 102_1se, 102_2se, and 102_3se onto detection elements 140_1, 140_2, and 140_3 of electron detection device 140. Detection elements 140_1, 140_2, and 140_3 can detect corresponding secondary electron beams 102_1se, 102_2se, and 102_3se and generate corresponding signals used to construct images of the corresponding scanned areas of sample 190.

Figure 3:
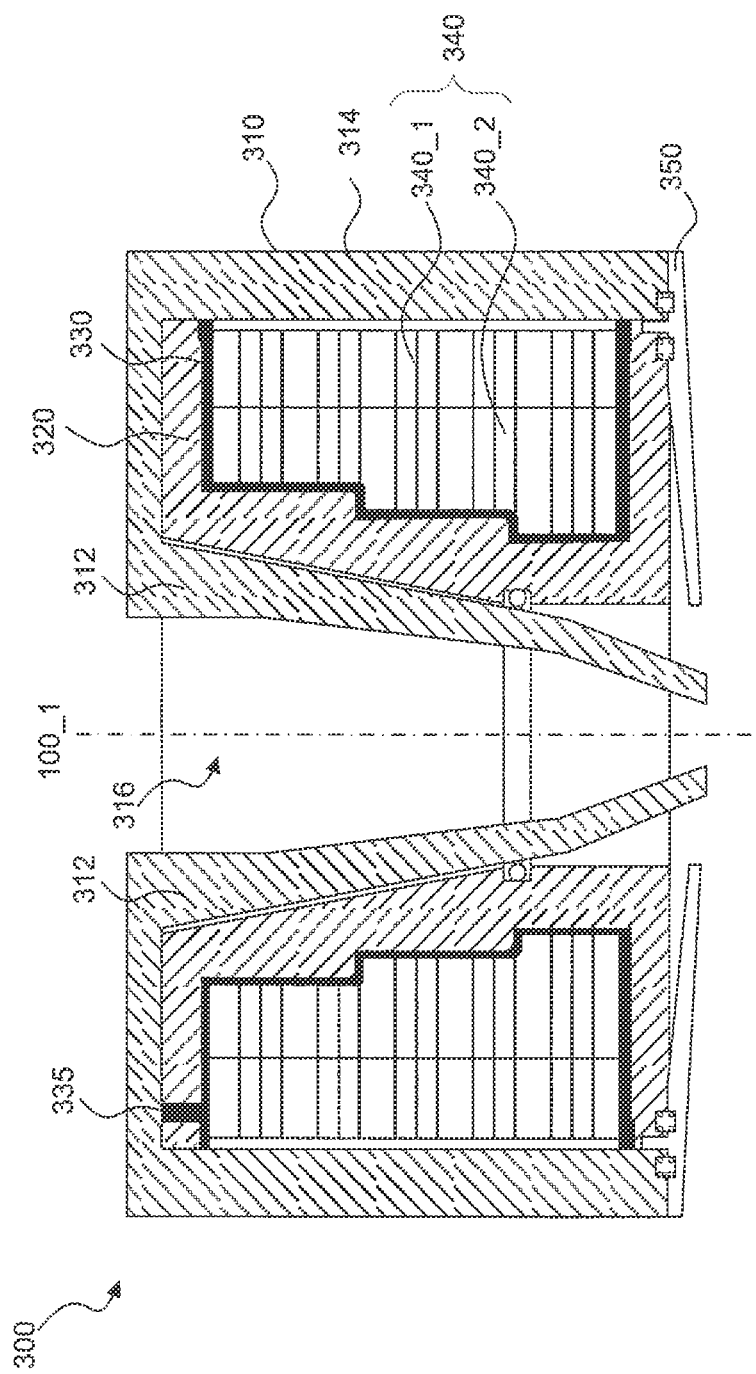
FIG. 3 illustrates a cross-section view of an exemplary objective lens structure of a charged-particle beam system, consistent with embodiments of the present disclosure.

Reference is now made to FIG. 3, which illustrates a cross-section view of an exemplary objective lens structure 300 of a charged-particle beam system (such as, charged-particle beam inspection system 1 of FIG. 1), consistent with embodiments of the present disclosure. Objective lens structure 300 may include an objective lens housing 310 having an inner wall 312 and an outer wall 314, a bobbin 320, a channel 330 comprising an inlet channel 335, electromagnetic coils 340, and a magnetic field guide 350. Objective lens structure 300 may include other components, not shown in FIG. 3, such as an objective lens assembly, electromagnetic coil isolators, thermal gap fillers, thermal sensors, etc., relevant to the functioning of objective lens structure 300.

Objective lens housing 310 may be configured to house at least a portion of objective lens 131. In some embodiments, objective lens housing 310 may house the entire objective lens 131. To obtain a higher resolution of images formed by a charged-particle beam (such as, primary electron beam 102 of FIG. 2) objective lens 131 may be an electromagnetic compound lens in which the sample may be immersed in the magnetic field of objective lens 131. In some embodiments, objective lens 131 includes a magnetic lens and an electrostatic lens (not illustrated). The magnetic lens may be configured to focus the charged-particle beam, or each primary beamlet in a multi-beam apparatus (such as, electron beam tool 100 of FIG. 2), at relatively low aberrations to generate relatively small probe spots on a sample. The electrostatic lens may be configured to influence the landing energy of the charged-particle beam or each primary beamlet to ensure that the primary charged-particles land on the sample at a relatively low kinetic energy and pass through the apparatus with a relatively high kinetic energy. In some embodiments, objective lens 131 may be configured to be an "immersion lens." As a result, the sample may be immersed both in an electrostatic field E (electrostatic immersion) of the electrostatic lens and a magnetic field B (magnetic immersion) of the magnetic lens. Electrostatic immersion and magnetic immersion may reduce aberrations of objective lens 131. As electrostatic and magnetic fields get stronger, the aberrations of objective lens 131 may become smaller. Electrostatic field E, however, should be limited to within a safe range in order to avoid discharging or arcing on the sample. Due to this limitation of the field strength of electrostatic field E, further enhancement of the magnetic field strength in an immersion configuration may allow a further reduction in the aberrations of objective lens 131, and thereby improve image resolution.

In some embodiments, objective lens housing 310 may house at least a portion of coils 340, a portion of bobbin 320, and channel 330. Objective lens housing 310 may comprise a ferromagnetic material including, but not limited to, cobalt, nickel, iron, chromium dioxide, or alloys thereof. Ferromagnetic materials, as described herein, may refer to materials that have a large, positive susceptibility to an external magnetic field. Ferromagnetic materials exhibit a strong attraction to magnetic fields and are able to retain their magnetic properties after the external field has been removed.

In some embodiments, objective lens housing 310 may comprise a material having low thermal conductivity including, but not limited to, ceramic materials such as cerium oxide, silica, fused silica, quartz, zirconium dioxide, etc. In some embodiments, objective lens housing 310 may comprise a material coated with a low thermal conductivity material, such as, for example, cerium oxide. The low thermal conductivity materials may be useful in minimizing heat loss from objective lens structure 300 to neighboring components, for example, stage positioning module, metroframe supporting the stage positioning module, mirror-block, high voltage plates, clamps, etc. In some embodiments, a portion of objective lens housing 310 may comprise a reflective coating to reduce heat loss due to radiation. Other suitable techniques to reduce heat loss and heat transfer may be applied as well.

In some embodiments, objective lens housing 310 may comprise inner wall 312 proximal to primary optical axis 100_1 and outer wall 314 distal from primary optical axis 100_1. Inner wall 312 and outer wall 314 may comprise different materials, the same material coated with different materials, etc., based on the design considerations and the application. For example, inner wall 312 may comprise a ferromagnetic material (e.g., iron) configured to concentrate the magnetic field generated by passing electric current through coils 340, and outer wall 314 may comprise a low thermal conductivity material (e.g., cerium oxide) configured to minimize heat loss to the external surroundings. Other suitable materials and combination of materials may be used, as needed.

In some embodiments, objective lens housing 310 may comprise a cylinder having a central bore 316, configured to receive objective lens 131. As shown in FIG. 3, central bore 316 is defined by boundaries of inner surface of inner wall 312 and may be designed to conform to the shape and contours of objective lens 131.

As illustrated in the cross-section in FIG. 3, bobbin 320 may be disposed in an area between inner wall 312 and outer wall 314 of objective lens housing 310. In some embodiments, at least a portion of bobbin 320 may be coupled to a portion of outer wall 314, or a portion of inner wall 312, or other portions of objective lens housing 310 by welding, hot-pressing, gluing, mechanical coupling, etc. Other fastening techniques may be employed based on the materials and application.

In some embodiments, objective lens structure 300 may comprise bobbin 320 having channel 330 or a plurality of channels 330. A channel, as referred to herein, may be a path through which a fluid may pass or circulate, and may include more than one channel. In some embodiments, bobbin 320 comprises a plurality of channels 330 through which a fluid may circulate. The fluid may comprise a cooling fluid including, but not limited to, a coolant, a cooling liquid, water, gas, compressed gas, or mixtures thereof. It should be appreciated that channel, plurality of channels, channels and cooling channels may be interchangeably used herein.

In some embodiments, bobbin 320 having cooling channels 330 may comprise a single material having thermal conductivity in the range of 20-2000 W·m−1·K−1 under standard measurement conditions, for example, materials including but not limited to aluminum, titanium, copper, graphite, aluminum nitride, aluminum carbide, metal alloys, metal-ceramic composites, etc. In some embodiments, bobbin 320 having cooling channels 330 may comprise more than one material having different thermal conductivities and machinability, for example, a portion of bobbin 320 may comprise aluminum and cooling channels 330 may comprise titanium. Other combinations may be possible as well.

In some embodiments, bobbin 320 having a plurality of channels 330 may comprise a monolithic structure. A monolithic structure, as referred to herein, may be defined as a structure made from a single piece of material. For example, monolithic structures may be formed either by a subtractive manufacturing process or an additive manufacturing process. Subtractive manufacturing process is a process by which three-dimensional (3D) objects are created by successively cutting material away from a single block of material, either manually or using a computer numerical control (CNC) machine. Additive manufacturing process is a process of creating three-dimensional components by depositing overlapping layers of material under the guided control of a computer, for example, 3D printing.

Figure 4:
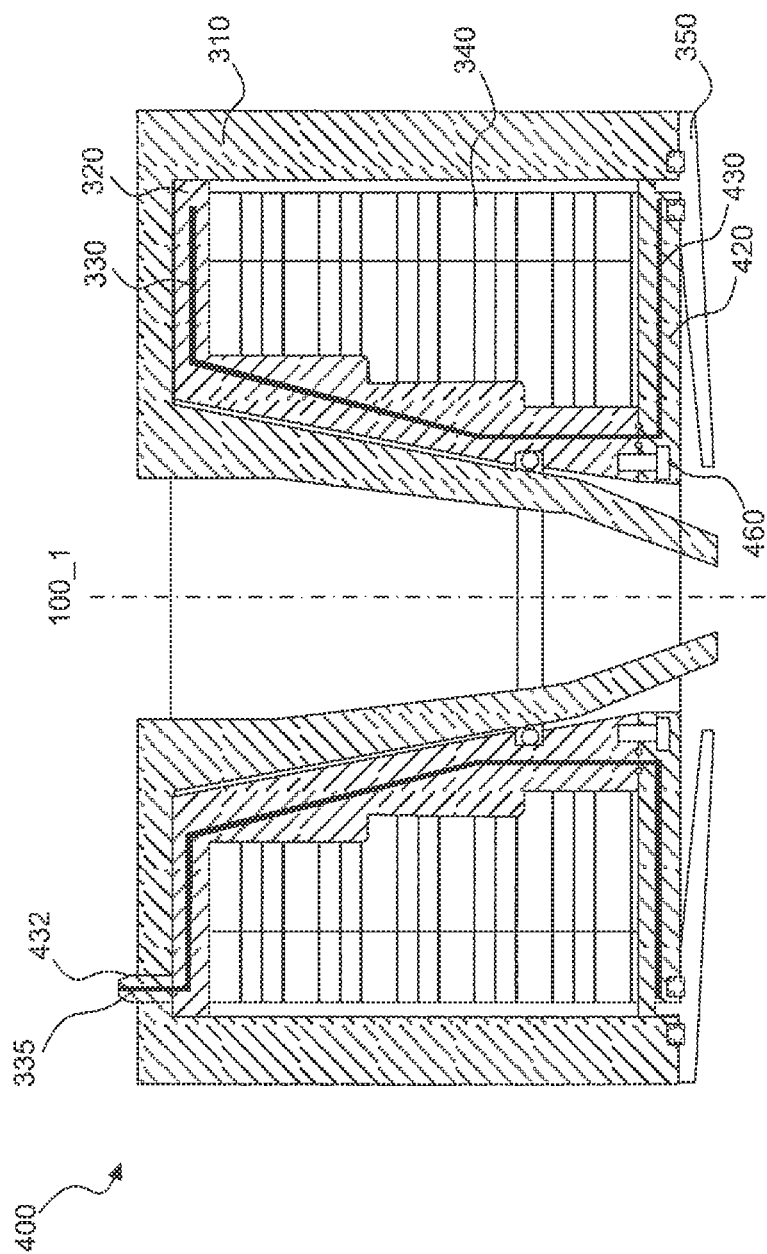
FIG. 4 illustrates a cross-section view of an exemplary objective lens structure of a charged-particle beam system, consistent with embodiments of the present disclosure.

In some embodiments, bobbin 320 having channels 330 may comprise an additively manufactured monolithic structure. Additively manufactured bobbin 320 having channels 330 may comprise a single metal, such as, for example, aluminum or titanium. In such a configuration, the heat transfer or heat dissipation may be more efficient due to the uniformity in thermal conductivity of the structure. Higher heat transfer efficiency may minimize thermal drift effects on wafer 190 and may also minimize exposure of heat-sensitive components such as, mirror block, stage positioning module, etc. to high temperature. Additively manufactured bobbin 320 having channels 330 may have numerous advantages over the existing designs of bobbins for cooling objective lens structures in charged-particle beam systems. An additively manufactured bobbin may have some or all of the advantages discussed herein, among others.

i. Efficient heat transfer—The heat transfer efficiency may be further enhanced due to the proximity of channel 330 to the heat source (e.g., electromagnetic coils 340). As illustrated in FIG. 3, channel 330 may be adjacent or immediately adjacent electromagnetic coils 340 through which large electric current may be passed to generate magnetic field for objective lens 131. At least a portion of channel 330 may present a thermal barrier to wafer 190, objective lens 131 placed in central bore 316, or stage positioning module, thus maintaining the performance and accuracy of charged-particle beam systems by dissipating the heat more efficiently through channel 330.

ii. Enhanced cooling capacity—3D printing the bobbin having a larger number of fluid channels may allow for enhanced cooling capacity owing to the larger volume of fluid that can be passed through the multiple channels. Additionally, having more fluid channels may reduce the heat build-up as well as the pressure-drop within the channels, minimizing thermo-mechanical stresses. 3D printing may also enable complex fluid channel configurations within the bobbin, as required.

iii. Enhanced structural integrity and reliability—The occurrence of mechanical failures such as, for example, leaks, cracks, material fatigue, deformation, stress due to thermal expansion coefficient mismatch, etc. may be minimized or eliminated.

iv. Efficient space utilization—Additively manufactured bobbin 320 may provide more efficient space utilization in a charged-particle beam system. For example, cooling channel 330 may be configured to be disposed within the bobbin, eliminating the need for external cooling tubes, thus facilitating compact structures.

v. Material and design flexibility—Additive manufacturing involves depositing successive layers under the guidance of a computer, allowing selecting a different material for one or more layers within the structure. In the context of this disclosure, for example, a bobbin having an aluminum body with a titanium channel disposed within the aluminum bobbin may be fabricated (such as shown in FIG. 4).

vi. Higher throughput and low cost—Improved reliability and structural integrity of additively manufactured bobbin 320 may result in higher inspection throughput and low maintenance costs due to reduced maintenance and service down-times.

vii. Reduced flow-induced vibration—3D printing the bobbin having multiple channels may enable a better design with respect to flow-induced vibrations because of lower flow velocity through the channels and natural fluid forms in design. High fluid velocity and sharp edges may be associated with changing forces due to turbulence or unstable flows. The turbulence and instability in the fluid flow may cause vibration of the bobbin, affecting the charged-particle beam measurement and focus.

In some embodiments, channels 330 may be disposed on the outer surface of bobbin 320 and may be arranged vertically, or horizontally, or circumferentially around bobbin 320. In some embodiments, channels 330 may be disposed within bobbin 320 (as shown in FIG. 4), and may be arranged vertically, or horizontally, or circumferentially within bobbin 320. Other channel layouts and configurations may be suitably used.

In some embodiments, bobbin 320 may comprise inlet channel 335 configured to circulate a fluid through channel 330. A fluid, as referred to herein, may comprise, among others, a liquid, a coolant, a cooling liquid, a gas, a compressed gas, or mixtures thereof. The fluid may be configured to absorb heat generated by passing large electric current through electromagnetic coils 340 (discussed later). The fluid may be circulated through channel 330 before dispensing out via outlet channel (not illustrated).

Channel 330 may comprise a single loop around bobbin 320. In some embodiments, channel 330 may comprise multiple loops around bobbin 320, based on the application and system cooling requirements. In some embodiments, channel 330 may comprise one or more input channels and a single output channel. For example, in a multi-beam apparatus, where more than one region of objective lens structure 300 may require temperature control, an additional inlet channel 335 may be used. In some embodiments, channel 330 may comprise a single input channel and multiple output channels. Other combinations of numbers and configurations of input channels and output channels may be suitably designed and employed.

In some embodiments, a surface forming channel 330, also referred to as the external surface of channel 330, may have surface features, for example, micro-indentations, nano-indentations, protrusions, roughening texture, etc. to increase the surface area for enhanced heat transfer. In some embodiments, the external surface features may be introduced after bobbin 320 having channel 330 is manufactured or fabricated. Alternatively, the external surface features may be incorporated in the original design prior to being additively manufactured using a 3D printer.

In some embodiments, channel 330 may comprise an enclosed path, for example, a channel having a circular or an elliptical cross-section, and a wall thickness. The shape of the cross-section and the area of the cross-section may be determined based on the application, space availability, material compatibility, or cooling requirements of the system. In some embodiments, for example, channel 330 having a circular cross-section may have an outer diameter of 4 mm, a uniform wall thickness of 0.5 mm, and an inner diameter of 3 mm. Channel 330 may comprise uniform or non-uniform wall thicknesses. It should be appreciated that the size, shape, cross-section, area, total volume and other relevant dimensions of channel 330 may be determined and designed, as needed.

In some embodiments, objective lens structure 300 may comprise electromagnetic coils 340 configured to adjust the focus of a single or multiple charged-particle beams on wafer 190. Electromagnetic coils 340 may comprise an electrical conductor, such as a wire in the shape of a coil, spiral, helix, etc. An electric current may be passed through electromagnetic coils 340 to produce a circular magnetic field around the conductor. In a coil configuration, such as illustrated in FIG. 3, the electrical conductor may be wound around bobbin 320 multiple times to increase the magnetic field density of objective lens 131 placed in central bore 316. Electromagnetic coils 340 may comprise an electrical conductor including, but no limited to, copper, aluminum, silver, etc.

In some embodiments, electromagnetic coils 340 may comprise a fine focus coil 340_1 and a coarse focus coil 340_2 configured to focus charged-particle beam 102_1. Fine focus coil 340_1 and coarse focus coil 340_2 may comprise different materials or different dimensions. Alternatively, the amount of electric current passed through fine focus coil 340_1 and coarse focus coil 340_2 may be adjusted to vary the magnetic field generated to control the overall beam focus. In some embodiments, the electrical conductor wire, such as copper wire, may be encapsulated with an insulating material. Due to the large amount of heat generated by passing electrical current through electromagnetic coils 340, a thermal gap filler material may be applied between each layer of coils. The thermal gap filler material may comprise thermal gap filler gels, putty, or pads having a thermal conductivity of 1 $W \cdot m^{-1} \cdot K^{-1}$ or higher, to dissipate the local heat and electrical resistance of $5 \times 10^{12}$ ohms or higher to provide electrical insulation between two layers of conductor coil. It should be appreciated that other suitable thermal gap filler materials may be used as well.

In some embodiments, objective lens structure 300 may comprise magnetic field guide 350, as shown in FIG. 3, configured to guide the magnetic field generated by electromagnetic coils 340 towards objective lens 131. In some embodiments, magnetic field guide 350 may be configured to minimize exposure of wafer 190 to magnetic field created in electromagnetic coils 340 or other stray magnetic field. Magnetic field guide 350 may be clamped or coupled to outer wall 314 of objective lens housing 310 or bobbin 320 using suitable coupling techniques including, but not limited to, welding, gluing, mechanical fastening, epoxy bonding, brazing, ultrasonic welding, soldering, etc.

In some embodiments, a bobbin may be configured or optimized to be located in a vacuum chamber. In a vacuum, a significant heat transfer mechanism is radiation. As such, it is advantageous to be able to cool portions of a bobbin that radiate towards heat-sensitive elements. For example, it may be advantageous to have a channel 330 embedded near a surface of bobbin 320 that radiates towards a wafer so as to cool this surface and to resultantly reduce the amount of heat radiated from bobbin 320 to the wafer.

Some techniques for manufacturing a bobbin do not facilitate creation of channels in desirable or optimal locations for a bobbin configured to be located in a vacuum chamber. For example, while it may be possible to machine channels in certain locations of a bobbin, such as the outer surface, it may be impractical to machine channels in other locations of the bobbin. An additively manufactured monolithic bobbin can create a bobbin that is configured or optimized to be located in a vacuum chamber. As a result of the manufacture process, channel 330 can be located in any desirable location for cooling a portion of bobbin 320 that radiates towards a heat-sensitive element. Further, the monolithic nature of bobbin 320 improves its performance in a vacuum, such as by supporting more efficient cooling of the portions of the bobbin that radiate heat, and by sustaining a superior vacuum with no contamination. A bobbin with seams between materials/structures (e.g., seams between structures that are bonded together to form the bobbin) may suffer from less efficient cooling of the bobbin, such as due to the reduced heat transfer at material/structure interfaces, may suffer from an inferior vacuum, such as due to the seams between the materials/structures, and may suffer from contamination, such as due to the materials used to bond the multiple materials/structures of the bobbin together.

Reference is now made to FIG. 4, which illustrates a cross-section view of an exemplary objective lens structure 400 of a charged-particle beam system (such as, charged-particle beam inspection system 1 of FIG. 1), consistent with embodiments of the present disclosure. Objective lens structure 400 may include channel 330 disposed within bobbin 320, an inlet port 432 comprising at least a portion of inlet channel 335, cooling plate 420 comprising a cooling channel 430.

In some embodiments, cooling plate 420 may be coupled with bobbin 320 such that channel 330 and cooling channel 430 are aligned to form a continuous channel for circulating the fluid. Cooling plate 420 may be coupled with bobbin 320 and outer wall 314 of objective lens housing 310. In some embodiments, cooling plate 420 may be coupled with bobbin 320 by a fastening mechanism 460 including, but not limited to, mechanical fastening, welding, ultrasonic welding, soldering, gluing, epoxy bonding, brazing, etc. Cooling plate 420 may comprise, among others, a ferromagnetic material or a high thermal conductivity material. In a preferred embodiment, cooling plate 420 and bobbin 320 comprise similar material to minimize heat transfer losses due to a mismatch in thermal coefficients and heat transfer capacity.

In some embodiments, channel 330 may be disposed within bobbin 320, and cooling channel 430 may be disposed within cooling plate 420 such that, upon assembling, channel 330 and cooling channel 430 are aligned to form a continuous circulation path for the fluid. Cooling plate 420 having cooling channel 430 may be additively manufactured using a 3D printer, or subtractively manufactured using a CNC machine.

In some embodiments, inlet port 432 may be configured to receive the fluid from a fluid source. Inlet port 432 may comprise at least a portion of inlet channel 335. Inlet port 432 may be externally attached to bobbin 320 using mechanical fastening methods. Alternatively, inlet port 432 may be integrally connected with bobbin 320. For example, bobbin 320 including inlet port 432 having inlet channel 335 may be additively manufactured using a 3D printer. In some embodiments, bobbin 320 including inlet port 432 having inlet channel 335 may be subtractively manufactured using a CNC machine or a lathe.

Figure 5:
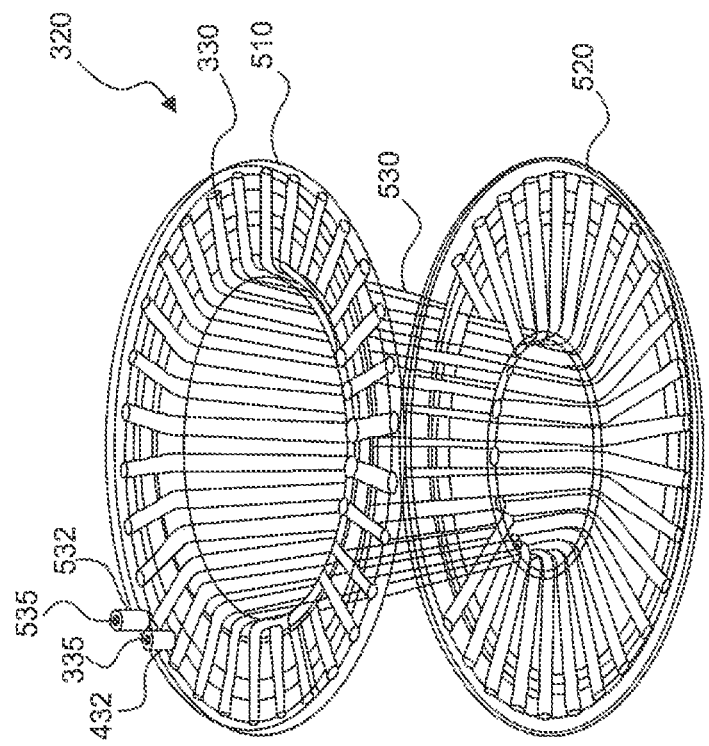
FIG. 5 is a schematic diagram illustrating an exemplary bobbin for cooling the objective lens of the charged-particle beam system, consistent with embodiments of the present disclosure.
Figure 9:
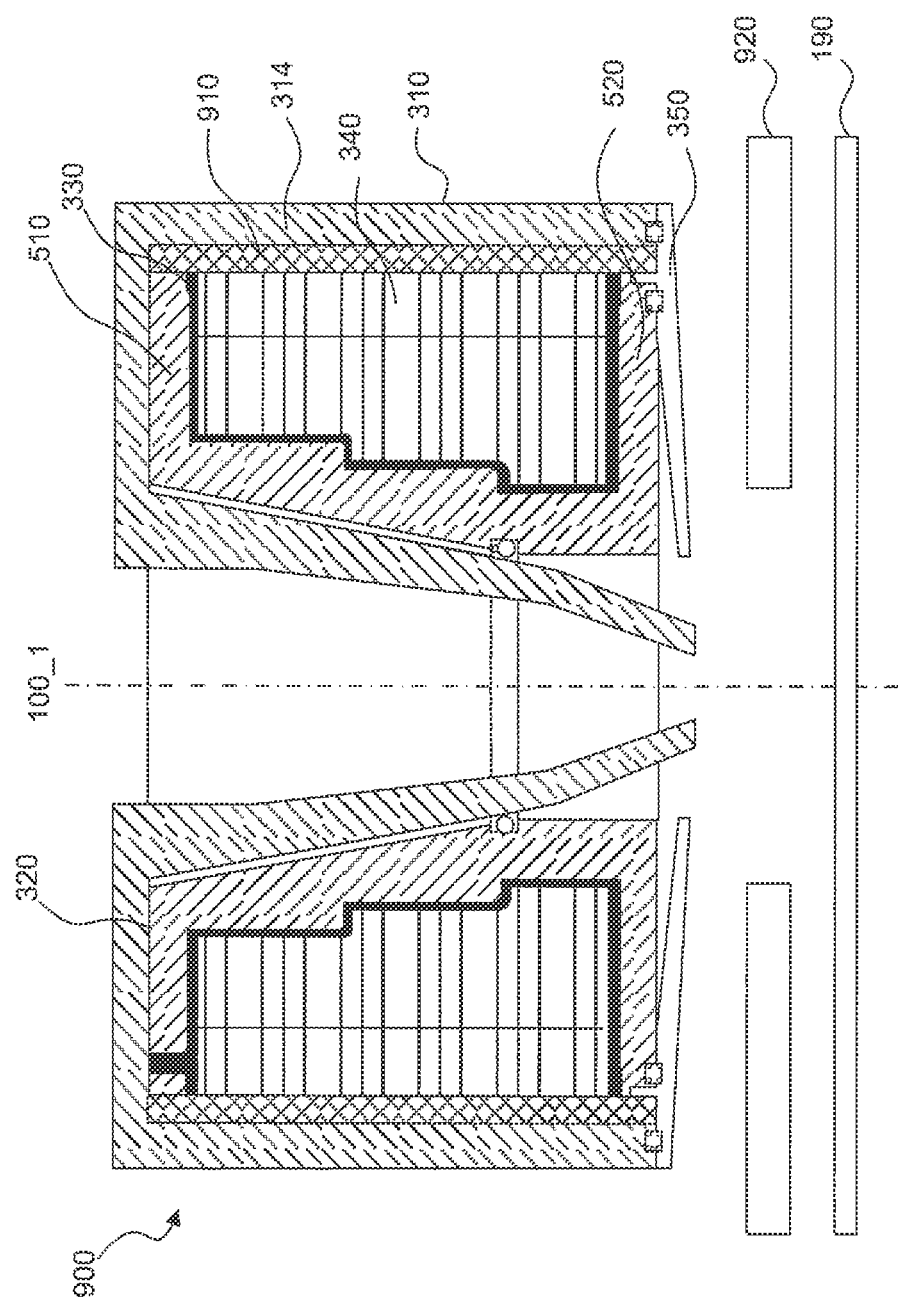
FIG. 9 illustrates a cross-section view of an exemplary objective lens structure of a charged-particle beam system, consistent with embodiments of the present disclosure.

Reference is now made to FIG. 5, a schematic drawing of an exemplary bobbin 320 for cooling objective lens of the charged-particle beam system, consistent with embodiments of the present disclosure. Bobbin 320 may include a top flange 510, a bottom flange 520 and a body portion 530 connecting top flange 510 and bottom flange 520. Bobbin 320 may be disposed in an objective lens structure (such as, objective lens structure 300 of FIG. 3 or objective lens structure of FIG. 4) such that bottom flange 520 is proximal to the wafer (such as wafer 190 of FIG. 9) and top flange 510 is opposite bottom flange 520 and distal from wafer 190. In the context of this disclosure, proximal and distal refer to the distance along a longitudinal axis of bobbin 320, with reference to a horizontal plane along which wafer 190 or wafer stage may be disposed. For example, as illustrated in FIG. 9 (discussed later), top flange 510 of bobbin 320 is farther away (distal) from the wafer and bottom flange 520 of bobbin 320 is closer (proximal) to the wafer. In some embodiments, the longitudinal axis of bobbin 320 may align with primary optical axis 100_1.

In some embodiments, body portion 530 may be cylindrical, conical, or any suitable shape. As illustrated in FIG. 5, the smaller diameter end of body portion 530 may be connected with bottom flange 520 and the larger diameter end of conical body portion 530 may be connected with top flange 510. Other configurations may be suitably used. In some embodiments, the shape of body portion 530 may be determined based on the shape of objective lens 131 used.

In some embodiments, bobbin 320 may include inlet port 432 comprising a portion of inlet channel 335, and an outlet port 532 comprising a portion of outlet channel 535. Bobbin 320 may comprise channel 330 distributed in bobbin 320 and configured to circulate the fluid received by inlet port 432, and outlet port 532 configured to dispense the fluid circulated by the channel 330. Inlet channel 335 may be configured to circulate the fluid received from inlet port 432 and outlet channel 535 may be configured to direct the circulating fluid to outlet port 532. Outlet port 532 may be externally attached to bobbin 320 using mechanical fastening methods. Alternatively, outlet port 532 may be integrally connected with bobbin 320. For example, bobbin 320 including outlet port 532 having outlet channel 535 may be additively manufactured using a 3D printer. In some embodiments, bobbin 320 including outlet port 532 having outlet channel 535 may be subtractively manufactured using a CNC machine or a lathe.

Figure 6B:
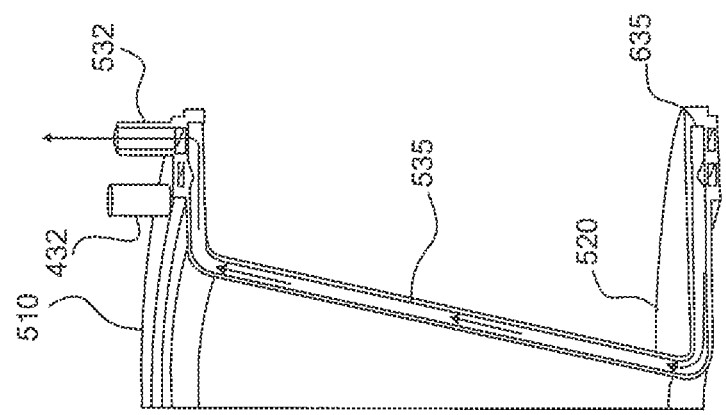
FIGS. 6A and 6B illustrate cross-section views of an exemplary bobbin illustrating fluid channels therein, consistent with embodiments of the present disclosure.
Figure 6A:
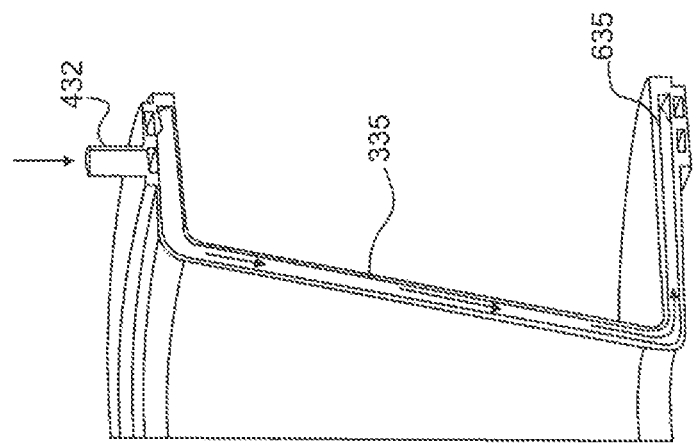

Reference is now made to FIGS. 6A and 6B, which illustrate cross-section views of channel 330 of bobbin 320 of FIG. 5, consistent with embodiments of the present disclosure. Channel 330 may comprise inlet channel 335, outlet channel 535, and an intermediate channel 635. Inlet channel 335 may be configured to circulate the fluid received from inlet port 432, outlet channel 535 may be configured to direct the circulated fluid to outlet port 532, and intermediate channel 635 may be configured to fluidly connect inlet channel 335 and outlet channel 535 and recirculate the fluid in a portion of bobbin 320. In some embodiments, inlet channel 335, intermediate channel 635, and outlet channel 535 may have uniform cross-section and diameters throughout channel 330.

As shown in FIG. 6B, inlet port 432 and outlet port 532 are positioned adjacent each other on top flange 510. In some embodiments, inlet port 432 and outlet port 532 may be positioned away from each other, for example, diametrically opposite to each other on top flange 510, or a radial distance away from each other on top flange 510.

Figure 7:
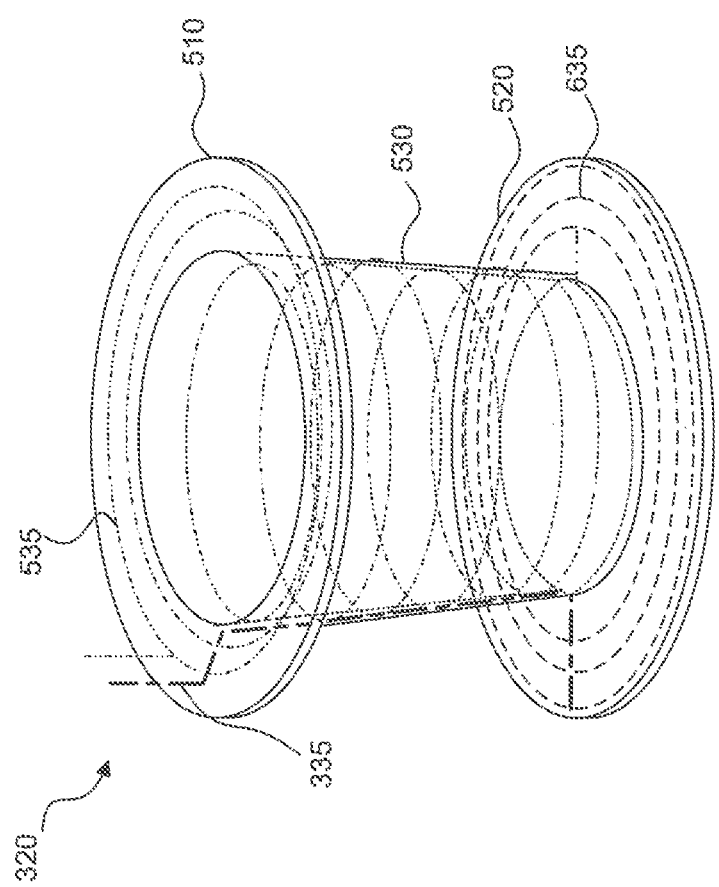
FIG. 7 is a schematic diagram illustrating a fluid flow direction in an exemplary bobbin, consistent with embodiments of the present disclosure.

FIG. 7 illustrates a fluid flow direction in an exemplary bobbin, consistent with embodiments of the present disclosure. Bobbin 320 of FIG. 7 may include inlet channel 335, intermediate channel 635, and outlet channel 535, as illustrated. Inlet channel 335 may be configured to receive the fluid through inlet port 432 (not shown) in top flange 510 of bobbin 320. Inlet channel 335 may also be configured to transport the received fluid from top flange 510 to bottom flange 520. Intermediate channel 635 may be configured to circulate the fluid in bottom flange 520 and absorb heat generated by electromagnetic coils 340 wound around bobbin 320. Intermediate channel 635 may comprise a channel arranged in concentric circles (as shown in FIG. 7), in spirals, in sinusoidal wave-patterns, etc., as desired. Intermediate channel 635 may be configured to fluidly connect inlet channel 335 and outlet channel 535. Outlet channel 535 may be configured to absorb heat and direct the circulated fluid from intermediate channel 635 to outlet port 532 (not shown). As illustrated in FIG. 7, outlet channel 535 may be circumferentially wound around body portion 530 and top flange 510 of bobbin 320, dispensing the circulated fluid into outlet port 532.

In some embodiments, inlet channel 335, intermediate channel 635 and outlet channel 535 may comprise channels having different materials, dimensions and cross-sections.

Figure 8:
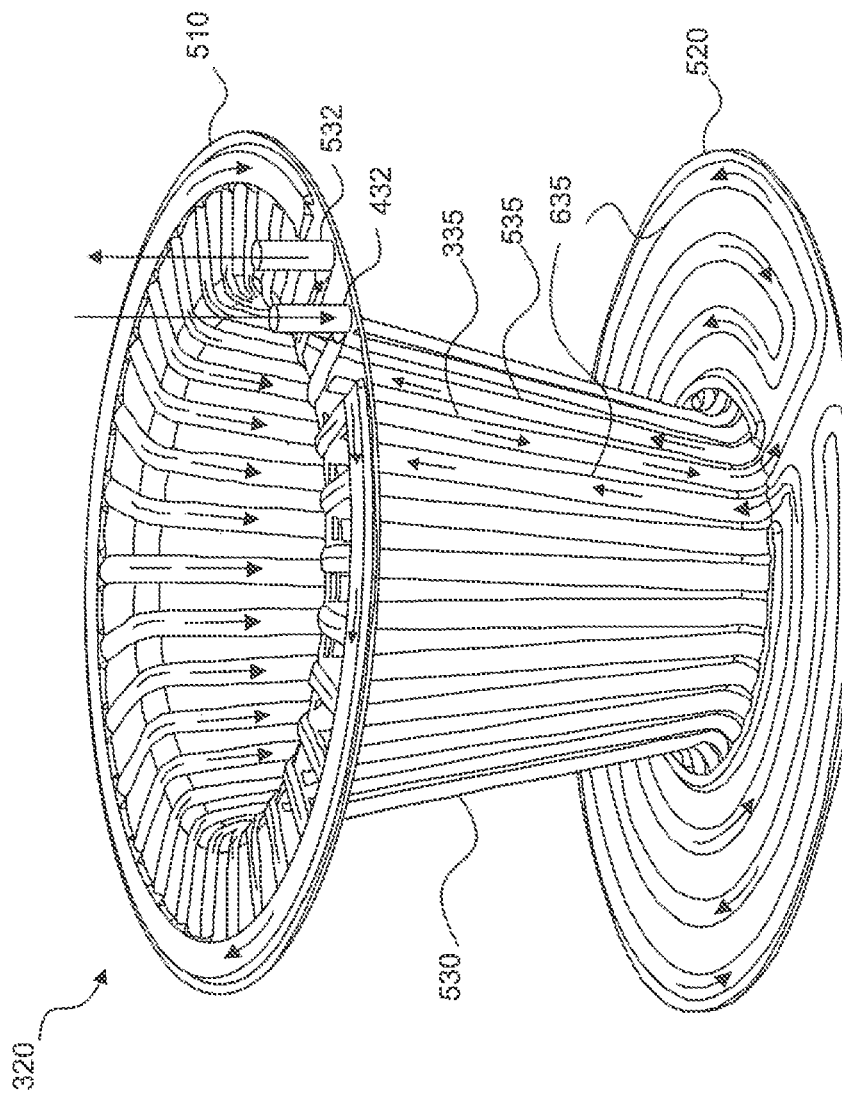
FIG. 8 is a schematic diagram illustrating a fluid flow direction in an exemplary bobbin, consistent with embodiments of the present disclosure.

FIG. 8 illustrates a fluid flow direction in an exemplary bobbin, consistent with embodiments of the present disclosure. As shown in FIG. 8, fluid may be introduced into inlet channel 335 from a fluid source through inlet port 432. Inlet channel 335 may be configured to transport fluid from top flange 510 to bottom flange 520 through extension of inlet channel 335 longitudinally along body portion 530. Channel 330 arranged in bottom flange 520 may comprise a portion of inlet channel 335, a portion of intermediate channel 635, a portion of outlet channel 535, or combinations thereof.

In some embodiments, cooling of an objective lens through fluid flow in bobbin 320 may be described as a multi-step process. It should be appreciated that the number and the order of steps are exemplary, but not limiting, and may be modified as required.

Step 1 may include receiving a fluid in inlet channel 335 from inlet port 432. Inlet channel 335 may extend from top flange 510 through body portion 530. In some embodiments, inlet channel may extend to at least a portion of bottom flange 520.

Large temperature gradients caused by thermal radiation between bobbin 320 and wafer 190 may cause several problems including, but not limited to, thermal drift, local thermal expansion, microscopic structural defects or hot spots on wafer 190. Step 2 may include conditioning bottom flange 520 by circulating the fluid immediately after receiving from a fluid source through inlet port 432. Conditioning bottom flange 520 which is proximal to wafer 190 may provide temperature stability and may minimize the temperature gradient between bottom flange 520 and wafer 190, by presenting a thermal barrier to radiation.

Step 3 may include directing the circulated fluid from bottom flange 520 to top flange 510 via intermediate channel 635. Intermediate channel 635 may also be configured to circulate the fluid in a channel radially disposed on top flange 510 of bobbin 320.

Step 4 may include directing the fluid downward from top flange 510 to bottom flange 520 through a plurality of channels disposed on body portion 530 of bobbin 320. Step 3 and step 4, in combination, may comprise cooling of objective lens structure 300 by absorbing heat generated by electromagnetic coils 340.

Step 5 may include directing the fluid from the plurality of downward channels into outlet channel 535 and causing the fluid to dispense out through outlet port 532.

In some embodiments, a temperature of fluid circulating through inlet channel 335, intermediate channel 635, and outlet channel 535 may be monitored using thermal sensors. One or more thermal sensors may be disposed in channel 330, on bobbin 320, or in a remote location. In some embodiments, amount of fluid flowing through channel 330 may be determined using one or more flow meters. Other sensors and fluid control switches and valves may be installed as needed.

FIG. 9 illustrates a cross-section view of an objective lens structure 900 of a charged particle beam system, consistent with embodiments of the present disclosure. Objective lens structure 900 may comprise a thermal insulation layer 910, high voltage plate 920 configured to accelerate or decelerate charged-particle beam incident towards wafer 190.

In some embodiments, thermal insulation layer 910 may be disposed circumferentially between electromagnetic coils 340 and outer wall 314 of objective lens housing 310. Thermal insulation layer 910 may prevent heat loss to the external surroundings and may concentrate the heat at the heat transfer region to be absorbed by fluid circulating through channel 330 of bobbin 320. Channel 330 and thermal insulation layer 910, in combination, may encompass electromagnetic coils 340, and thus help confine the heat generated by passing electric current through electromagnetic coils 340 to generate magnetic field for objective lens 131.

In some embodiments, thermal insulation layer 910 may comprise any material having good thermal insulation properties, for example, but not limited to, a gas, vacuum, thermal gap filler gels, silicone, ceramics, etc. In some embodiments, thermal insulation layer 910 may comprise a fluid channel configured to receive and circulate fluid to absorb heat. In such a configuration, electromagnetic coils 340 may be significantly thermally insulated from the surroundings, minimizing heat transfer due to radiation towards wafer 190 and heat transfer to neighboring components, including, but not limited to, metro-frame, stage positioning module, mirror block, sensors, etc.

Figure 10:
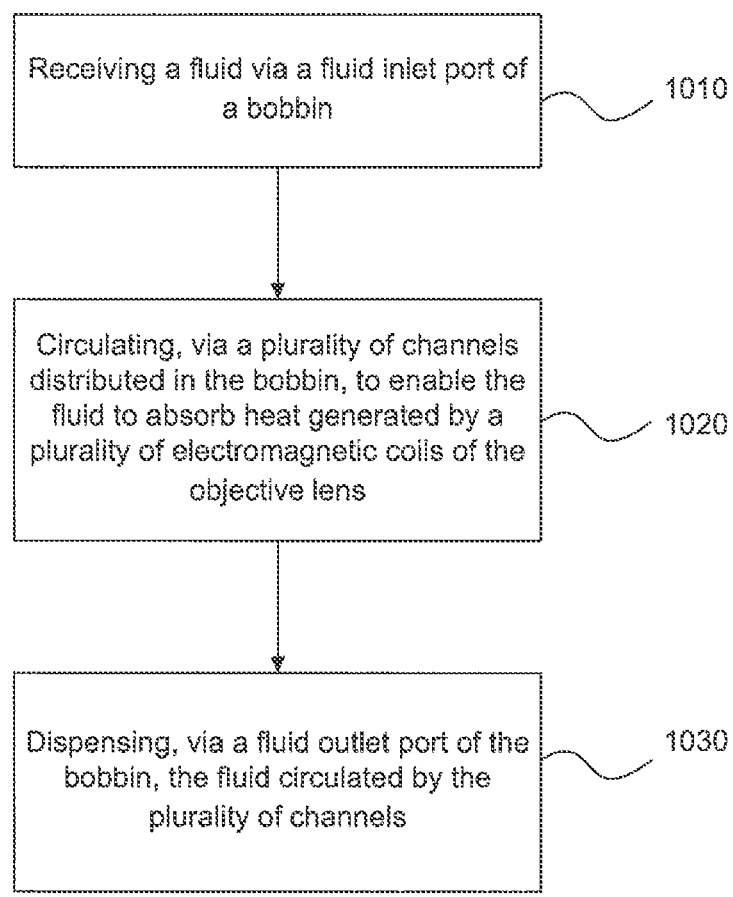
FIG. 10 is a process flow chart of an exemplary method of cooling the objective lens of the charged-particle beam system, consistent with embodiments of the present disclosure.

FIG. 10 is a process flow chart of an exemplary method of cooling the objective lens of the charged-particle beam system, consistent with embodiments of the present disclosure. The method of cooling the objective lens and objective lens structure may be performed by circulating fluid through channel (e.g., channel 330 of FIG. 3) of bobbin (e.g., bobbin 320 of FIG. 3).

In step 1010, a fluid may be received via a fluid inlet port (e.g., inlet port 432 of FIG. 4). The fluid may be received by an inlet channel (e.g., inlet channel 335 of FIG. 3), partially disposed in the inlet port. The fluid may comprise a cooling fluid including, but not limited to, a liquid, a coolant, a cooling liquid, water, gas, compressed gas, solvents, or mixtures thereof. In some embodiments, the temperature of the fluid entering the inlet channel may be equal or less than the desired temperature setpoint of a substrate or a wafer (e.g., wafer 190 shown in FIG. 9).

In some embodiments, channel 330 may comprise an enclosed path, for example, a channel having a circular or an elliptical cross-section, and a well thickness. The shape of the cross-section and the area of the cross-section may be determined based on the application, space availability, material compatibility, cooling requirements of the system, etc. In some embodiments, for example, channel 330 having a circular cross-section may have an outer diameter of 4 mm, a uniform wall thickness of 0.5 mm, and an inner diameter of 3 mm. Channel 330 may comprise uniform or non-uniform wall thicknesses. It should be appreciated that the size, shape, cross-section, area, total volume and other relevant dimensions of channel 330 may be determined and designed, as needed.

In step 1020, the fluid may be circulated through one or more channels distributed in the bobbin. The fluid may absorb heat generated by electromagnetic coils (e.g., electromagnetic coils 340 of FIGS. 3-4) of objective lens (e.g., objective lens 131 of FIG. 2). As described above, the bobbin may comprise one or more channels, collectively referred to as channel herein.

The channel may comprise an inlet channel configured to circulate the fluid received from a fluid source through an inlet port. In some embodiments, the channel may also comprise an intermediate channel (e.g., intermediate channel 635 of FIGS. 6-8) configured to circulate the fluid, and an outlet channel (e.g., outlet channel 535 of FIGS. 5-8) configured to direct the fluid to the outlet port after absorbing heat generated by the electromagnetic coils. In some embodiments, intermediate channel may receive the fluid from inlet channel and circulate the fluid in the top flange (e.g., top flange 510 of FIG. 5) of the bobbin, or the bottom flange (e.g., bottom flange 520 of FIG. 5) of the bobbin, or the body portion (e.g., body portion 530 of FIG. 5) of the bobbin.

In some embodiments, intermediate channel distributed in the bobbin may be configured to circulate the fluid in a pattern including, but not limited to, radial, longitudinal, spiral, circumferential, helical, latitudinal, or combinations thereof, based on the application and the requirement.

In some embodiments, intermediate channel distributed in the bobbin may be configured to circulate the fluid in a predefined flow direction. For example, after receiving the fluid from the inlet channel through the inlet port, the intermediate channel may circulate the fluid in the bottom flange, followed by an upward flow of the circulated fluid to the top flange. In the top flange, the fluid may be circulated radially along the circumference of the top flange while directing a portion of the fluid downward towards the bottom flange of the bobbin through a plurality of intermediate channels or fluid paths. The fluid may be circulated at least in a portion of the bottom flange and directed to the outlet channel configured to receive the circulated fluid after absorbing heat generated by passage of electric current through the electromagnetic coils to generate magnetic field for the objective lens. Other flow directions and flow routes may be employed suitably to absorb and dissipate heat efficiently away from the wafer and heat-sensitive components including, but not limited to, mirror block, stage positioning module, metro-frame, objective lens structure, etc.

In step 1030, the fluid circulated by the plurality of channels, such as inlet channel, intermediate channel, and output channel, may be dispensed via an outlet port (e.g., outlet port 532 of FIG. 5). In some embodiments, the outlet port may be configured to further recirculate the fluid into the inlet port after processing and cooling the fluid to a predetermined temperature suitable for introducing into the inlet port.

In some embodiments, the outlet port may be connected to a suction device such as, a vacuum pump, to create a negative pressure at least in a portion of the outlet channel. The negative pressure in the outlet channel may be useful in dispensing the circulated fluid out.

The disclosed bobbin 320 may be manufactured using conventional techniques such as, for example, techniques generally referred to as additive manufacturing or additive fabrication. Other conventional techniques, such as casting, or molding may be utilized, if desired. Known additive manufacturing/fabrication processes include techniques such as, for example, 3D printing. 3D printing is a process wherein material may be deposited in successive layers under the control of a computer. The computer controls additive fabrication equipment to deposit the successive layers according to a three-dimensional model (e.g., a digital file such as an additive manufacturing format (AMF) or stereolithography (STL) format) that is configured to be converted into a plurality of slices, for example substantially two-dimensional slices, that each define a cross-sectional layer of bobbin 320 in order to manufacture, or fabricate bobbin 320. In one case, the disclosed bobbin 320 would be an original component and the 3D printing process would be utilized to manufacture bobbin 320.

With reference to FIG. 11, the three-dimensional model 1101 used to represent an original bobbin 320 may be stored on a computer-readable storage medium 1102 such as, for example, magnetic storage including floppy disk, hard disk, magnetic tape; semiconductor storage such as solid state disk (SSD) or flash memory; optical disc storage; magneto-optical disc storage; cloud storage; or any other type of physical memory on which information or data readable by at least one processor may be stored. Computer-readable storage medium 1102 may be used in connection with commercially available 3D printers 1106 to manufacture, or fabricate bobbin 320. Alternatively, the three-dimensional model may be transmitted electronically to 3D printer 1106 in a streaming fashion without being permanently stored at the location of 3D printer 1106. In either case, the three-dimensional model constitutes a digital representation of bobbin 320 suitable for use in manufacturing bobbin 320.

The three-dimensional model may be formed in a number of known ways. In general, the three-dimensional model is created by inputting data 1103 representing bobbin 320 to a computer or processor 1104, such as a cloud-based software operating system. The data may then be used as a three-dimensional model representing the physical bobbin 320. The three-dimensional model is intended to be suitable for the purposes of manufacturing bobbin 320. In an exemplary embodiment, the three-dimensional model is suitable for the purpose of manufacturing bobbin 320 by an additive manufacturing technique.

In some embodiments, as illustrated in FIG. 11, the inputting of data may be achieved with a 3D scanner 1105. The method may involve contacting the bobbin via a contacting and data receiving device and receiving data from the contacting in order to generate the three-dimensional model. For example, 3D scanner 1105 may be a contact-type scanner. The scanned data may be imported into a 3D modeling software program to prepare a digital data set. In some embodiments, the contacting may occur via direct physical contact using a coordinate measuring machine that measures the physical structure of bobbin 320 by contacting a probe with the surfaces of bobbin 320 in order to generate a three-dimensional model. In some embodiments, 3D scanner 1105 may be a non-contact type scanner and the method may include directing projected energy such as, light or ultrasonic energy, onto bobbin 320 to be replicated and receiving the reflected energy. From this reflected energy, a computer would generate a computer-readable three-dimensional model for use in manufacturing bobbin 320. In various embodiments, multiple 2D images may be used to create a three-dimensional model. For example, 2D slices of a 3D object may be combined to create the three-dimensional model. In lieu of a 3D scanner, the inputting of data may be done using computer-aided design (CAD) software. In this case, the three-dimensional model may be formed by generating a virtual 3D model of the disclosed bobbin 320 using the CAD software. A three-dimensional model would be generated from the CAD virtual 3D model in order to manufacture bobbin 320.

The additive manufacturing process utilized to create the disclosed bobbin 320 may involve materials such as, metals, ceramics, metal alloys, ceramic composites, etc. In some embodiments, additional processes may be performed to create a finished product. Such additional processes may include, for example, one or more of cleaning, hardening, heat treatment, material removal, or polishing. Other processes necessary to complete a finished product may be performed in addition to or in lieu of these identified processes.

The embodiments may further be described using the following clauses:

1. A bobbin for cooling an objective lens of a charged-particle beam system, the bobbin comprising:
   a fluid inlet port configured to receive a fluid;
   a plurality of channels distributed in the bobbin and configured to circulate the fluid received by the fluid inlet port; and
   a fluid outlet port configured to dispense the fluid circulated by the plurality of channels.

2. The bobbin of clause 1, further comprising:
   a bottom flange proximal to a wafer in the charged-particle beam system; and
   a top flange distal from the wafer.

3. The bobbin of any one of clauses 1-2, wherein the plurality of channels comprises:
an inlet channel configured to circulate the fluid received from the fluid inlet port; and
an outlet channel configured to direct the circulating fluid to the fluid outlet port.
4. The bobbin of clause 3, wherein the plurality of channels further comprises an intermediate channel fluidly connected with the inlet and the outlet channel.
5. The bobbin of any one of clauses 1-4, wherein the circulated fluid absorbs heat generated by a plurality of electromagnetic coils wound around at least a portion of the bobbin.
6. The bobbin of any one of clauses 1-5, wherein the fluid comprises one of a liquid, a coolant, a gas, a compressed gas, or mixtures thereof.
7. The bobbin of any one of clauses 1-6, wherein the plurality of channels comprises a material having thermal conductivity in a range of 20-2000 $W \cdot m^{-1} \cdot K^{-1}$.
8. The bobbin of clause 7, wherein the material of the plurality of channels comprises aluminum, titanium, copper, graphite, aluminum carbide, aluminum nitride, plastics, composites, or alloys.
9. The bobbin of any one of clauses 1-8, wherein the bobbin having the plurality of channels comprises a monolithic structure.
10. The bobbin of clause 9, wherein the monolithic structure comprises an additively manufactured monolithic structure.
11. The bobbin of clause 10, wherein the additively manufactured monolithic structure comprises at least one of a metal, a metal alloy, a ceramic, or a ceramic composite.
12. The bobbin of any one of clauses 1-8, wherein the bobbin having the plurality of channels comprises a plurality of parts coupled together.
13. A method of creating a computer-readable three-dimensional model suitable for use in manufacturing the bobbin of clause 1, the method comprising:
inputting data representing the bobbin to a computer; and
using the data to represent the bobbin as a three-dimensional model, the three-dimensional model being suitable for use in manufacturing the bobbin.
14. An objective lens structure comprising:
a plurality of electromagnetic coils; and
a bobbin configured to circulate a fluid to absorb heat generated by the plurality of electromagnetic coils, the bobbin comprising:
a fluid inlet port configured to receive a fluid;
a plurality of channels distributed in the bobbin and configured to circulate the fluid received by the fluid inlet port; and
a fluid outlet port configured to dispense the fluid circulated by the plurality of channels.
15. The objective lens structure of clause 14, wherein the plurality of electromagnetic coils are wound around at least a portion of the bobbin.
16. The objective lens structure of any one of clauses 14 and 15, wherein the bobbin further comprises:
a bottom flange proximal to a wafer in the charged-particle beam system; and
a top flange distal from the wafer.
17. The objective lens structure of any one of clauses 14-16, wherein the plurality of channels comprises:
an inlet channel configured to circulate the fluid received from the fluid inlet port; and
an outlet channel configured to direct the circulating fluid to the fluid outlet port.
18. The objective lens structure of clause 17, wherein the plurality of channels further comprises an intermediate channel fluidly connected with the inlet and the outlet channel.
19. The objective lens structure of any one of clauses 14-18, wherein the fluid comprises one of a liquid, a coolant, a gas, a compressed gas, or mixtures thereof.
20. The objective lens structure of any one of clauses 14-19, wherein the plurality of channels comprises a material having thermal conductivity in a range of 20-2000 $W \cdot m^{-1} \cdot K^{-1}$.
21. The objective lens structure of clause 20, wherein the material of the plurality of channels comprises aluminum, titanium, copper, graphite, aluminum carbide, aluminum nitride, plastics, composites, or alloys.
22. The objective lens structure of any one of clauses 14-21, further comprising a thermal insulation layer disposed circumferentially between the plurality of electromagnetic coils and a ferromagnetic housing of an objective lens.
23. The objective lens structure of clause 22, wherein the thermal insulation layer comprises a fluid channel configured to absorb heat generated by the plurality of electromagnetic coils.
24. The objective lens structure of any one of clauses 14-23, wherein the bobbin having the plurality of channels comprises a monolithic structure.
25. The objective lens structure of clause 24, wherein the monolithic structure comprises an additively manufactured monolithic structure.
26. The objective lens structure of clause 25, wherein the additively manufactured monolithic structure comprises at least one of metals, metal alloys, ceramics, or ceramic composites.
27. The objective lens structure of any one of clauses 14-23, wherein the bobbin having the plurality of channels comprises a plurality of parts coupled together.
28. A method of cooling an objective lens of a charged-particle beam system, the method comprising:
receiving, via a fluid inlet port of a bobbin, a fluid;
circulating, via a plurality of channels distributed in the bobbin, to enable the fluid to absorb heat generated by a plurality of electromagnetic coils of the objective lens; and
dispensing, via a fluid outlet port of the bobbin, the fluid circulated by the plurality of channels.
29. The method of clause 28, wherein the bobbin further comprises:
a bottom flange proximal to a wafer in the charged-particle beam system; and
a top flange distal from the wafer.
30. The method of any one of clauses 28 and 29, wherein the plurality of channels comprises:
an inlet channel configured to circulate the fluid received from the fluid inlet port;
an outlet channel configured to direct the circulating fluid to the fluid outlet port; and
an intermediate channel fluidly connected with the inlet and the outlet channel.
31. The method of any one of clauses 28-30, wherein the circulated fluid absorbs heat generated by the plurality of electromagnetic coils wound around at least a portion of the bobbin.

32. The method of any one of clauses 28-31, wherein the fluid comprises one of a liquid, a coolant, a gas, a compressed gas, or mixtures thereof.
33. The method of any one of clauses 28-32, wherein the plurality of channels comprises a material having thermal conductivity in a range of 20-2000 $W \cdot m^{-1} \cdot K^{-1}$.
34. The method of clause 33, wherein the material of the plurality of channels comprises aluminum, titanium, copper, graphite, aluminum carbide, aluminum nitride, plastics, composites, or alloys.
35. The method of any one of clauses 28-34, further comprising circulating a second fluid in a fluid channel of a thermal insulation layer disposed circumferentially between the plurality of electromagnetic coils and a ferromagnetic housing of the objective lens.
36. The method of clause 35, wherein the second fluid comprises one of a liquid, a coolant, a gas, a compressed gas, or mixtures thereof.
37. The method of any one of clauses 28-36, wherein the bobbin having the plurality of channels comprises a monolithic structure.
38. The method of clause 37, wherein the monolithic structure comprises an additively manufactured monolithic structure.
39. The method of clause 38, wherein the additively manufactured monolithic structure comprises at least one of a metal, a metal alloy, a ceramic, or a ceramic composite.
40. The method of any one of clauses 28-36, wherein the bobbin having the plurality of channels comprises a plurality of parts coupled together.
41. A computer readable storage medium storing data representing a bobbin that is printable on a 3D printer, the bobbin comprising:
a fluid inlet port configured to receive a fluid;
a plurality of channels distributed in the bobbin and configured to circulate the fluid received by the fluid inlet port; and
a fluid outlet port configured to dispense the fluid circulated by the plurality of channels.
42. A computer readable three-dimensional model of a physical bobbin printable on a 3D printer, the bobbin comprising:
a fluid inlet port configured to receive a fluid;
a plurality of channels distributed in the bobbin and configured to circulate the fluid received by the fluid inlet port; and
a fluid outlet port configured to dispense the fluid circulated by the plurality of channels.
43. A bobbin for cooling an objective lens of a charged-particle beam system, the bobbin comprising:
a fluid inlet port configured to receive a fluid;
a plurality of channels distributed in the bobbin, the channels being configured to reduce heat radiated in a vacuum environment from a portion of the bobbin towards a heat-sensitive element, and being configured to circulate the fluid received by the fluid inlet port; and
a fluid outlet port configured to dispense the fluid circulated by the plurality of channels.
44. The bobbin of clause 43, wherein the heat-sensitive element is a wafer, further comprising: a bottom flange proximal to the wafer in the charged-particle beam system, a portion of the channels being positioned at locations of the bobbin to cool a portion of the bottom flange proximal to the wafer to facilitate a reduction in heat radiated from the bobbin and towards the wafer in the vacuum environment; and
a top flange distal from the wafer.
45. A computer readable storage medium storing data representing a bobbin that is printable on a 3D printer, the bobbin comprising:
a fluid inlet port configured to receive a fluid;
a plurality of channels distributed in the bobbin, the channels being configured to reduce heat radiated in a vacuum environment from the bobbin towards a heat-sensitive element, and being configured to circulate the fluid received by the fluid inlet port; and
a fluid outlet port configured to dispense the fluid circulated by the plurality of channels.
46. The medium of clause 45, wherein the heat-sensitive element is a wafer.
47. The medium of clause 45, wherein the channels being configured to reduce the heat radiated in the vacuum environment from the bobbin towards the heat-sensitive element include the channels being located at locations on the bobbin that cool a portion of the bobbin that radiates heat towards the heat-sensitive element.

A non-transitory computer readable medium may be provided that stores instructions for a processor (for example, processor 1104) to carry out thermal sensing, flow sensing, image inspection, image acquisition, stage positioning, beam focusing, electric field adjustment, cleaning, hardening, heat treatment, material removal, and polishing, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A bobbin for cooling an objective lens of a charged-particle beam system, the bobbin comprising:
    a fluid inlet port configured to receive a fluid;
    a plurality of channels distributed in the bobbin, the channels being configured to reduce heat radiated in a vacuum environment from a portion of the bobbin towards a heat-sensitive element, and being configured to circulate the fluid received by the fluid inlet port; and
    a fluid outlet port configured to dispense the fluid circulated by the plurality of channels,
        wherein the fluid inlet port and the fluid outlet port are located on an upstream end of the bobbin with respect to the heat-sensitive element.

2. The bobbin of claim 1, wherein the heat-sensitive element is a wafer, further comprising:
    a bottom flange proximal to the wafer in the charged-particle beam system, a portion of the channels being positioned at locations of the bobbin to cool a portion of the bottom flange proximal to the wafer to facilitate a reduction in heat radiated from the bobbin and towards the wafer in the vacuum environment; and
    a top flange distal from the wafer.

3. The bobbin of claim 1, wherein the plurality of channels comprises:
    an inlet channel configured to circulate the fluid received from the fluid inlet port; and
    an outlet channel configured to direct the circulating fluid to the fluid outlet port.

4. The bobbin of claim 3, wherein the plurality of channels further comprises an intermediate channel fluidly connected with the inlet and the outlet channel.

5. The bobbin of claim 1, wherein the circulated fluid absorbs heat generated by a plurality of electromagnetic coils wound around at least a portion of the bobbin.

6. The bobbin of claim 1, wherein the fluid comprises one of a liquid, a coolant, a gas, a compressed gas, or mixtures thereof.

7. The bobbin of claim 1, wherein the plurality of channels comprises a material having thermal conductivity in a range of 20-2000 $W \cdot m^{-1} \cdot K^{-1}$.

8. The bobbin of claim 7, wherein the material of the plurality of channels comprises aluminum, titanium, copper, graphite, aluminum carbide, aluminum nitride, plastics, composites, or alloys.

9. The bobbin of claim 5, wherein the plurality of electromagnetic coils is wound around an external surface of the bobbin.

10. The bobbin of claim 9, wherein the plurality of electromagnetic coils is located radially outward of the plurality of channels.

11. The bobbin of claim 1, wherein the bobbin having the plurality of channels comprises a monolithic structure.

12. The bobbin of claim 11, wherein the monolithic structure comprises an additively manufactured monolithic structure.

13. The bobbin of claim 12, wherein the additively manufactured monolithic structure comprises at least one of a metal, a metal alloy, a ceramic, or a ceramic composite.

14. The bobbin of claim 1, wherein the bobbin having the plurality of channels comprises a plurality of parts coupled together.

15. A non-transitory computer readable storage medium storing instructions for modifying a bobbin that is printable on a 3D printer, the bobbin comprising:
    a fluid inlet port configured to receive a fluid;
    a plurality of channels distributed in the bobbin, the channels being configured to reduce heat radiated in a vacuum environment from the bobbin towards a heat-sensitive element, and being configured to circulate the fluid received by the fluid inlet port; and
    a fluid outlet port configured to dispense the fluid circulated by the plurality of channels,
        wherein the fluid inlet port and the fluid outlet port are located on an upstream end of the bobbin with respect to the heat-sensitive element.

16. The non-transitory medium of claim 15, wherein the heat-sensitive element comprises a wafer.

17. The non-transitory medium of claim 15, wherein the channels being configured to reduce the heat radiated in the vacuum environment from the bobbin towards the heat-sensitive element include the channels being located at locations on the bobbin that cool a portion of the bobbin that radiates heat through the vacuum environment towards the heat-sensitive element.

* * * * *